United States Patent
Kim et al.

(10) Patent No.: US 10,639,875 B2
(45) Date of Patent: May 5, 2020

(54) WAFER BONDING APPARATUS AND WAFER BONDING SYSTEM INCLUDING THE SAME

(71) Applicant: Samsung Electronics Co., Ltd., Suwon-si (KR)

(72) Inventors: Tae-yeong Kim, Yongin-si (KR); Pil-kyu Kang, Hwaseong-si (KR); Seok-ho Kim, Hwaseong-si (KR); Kwang-jin Moon, Hwaseong-si (KR); Na-ein Lee, Seoul (KR); Ho-jin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 196 days.

(21) Appl. No.: 15/845,458

(22) Filed: Dec. 18, 2017

(65) Prior Publication Data

US 2018/0370210 A1    Dec. 27, 2018

(30) Foreign Application Priority Data

Jun. 21, 2017  (KR) ......................... 10-2017-0078588

(51) Int. Cl.
*B32B 37/10* (2006.01)
*H01L 21/67* (2006.01)
(Continued)

(52) U.S. Cl.
CPC .......... *B32B 37/10* (2013.01); *B32B 38/1808* (2013.01); *H01L 21/67092* (2013.01); *H01L 21/67253* (2013.01); *H01L 21/681* (2013.01); *H01L 21/6838* (2013.01); *H01L 21/68785* (2013.01); *H01L 24/08* (2013.01); *H01L 24/75* (2013.01); *H01L 24/80* (2013.01); *H01L 24/83* (2013.01); *B32B 38/1858* (2013.01);
(Continued)

(58) Field of Classification Search
None
See application file for complete search history.

(56) References Cited

U.S. PATENT DOCUMENTS 5,447,596 A * 9/1995 Hayase ............... H01L 21/6835
                                                          156/701
9,498,944 B2  11/2016 Izumi
(Continued)

FOREIGN PATENT DOCUMENTS

JP          3550320 A        1/2001
JP       2006-235603 A       9/2006
(Continued)

*Primary Examiner* — Jeffry H Aftergut
(74) *Attorney, Agent, or Firm* — Myers Bigel, P.A.

(57) ABSTRACT

Provided are a wafer bonding apparatus for accurately detecting a bonding state of wafers in a wafer bonding process and/or in a wafer bonding system including the wafer bonding apparatus. The wafer bonding apparatus includes a first supporting plate including a first surface and vacuum grooves for vacuum-absorption of a first wafer disposed on the first surface, a second supporting plate including a second surface facing the first surface. A second wafer is on the second surface. The wafer bonding apparatus and/or the wafer bonding system include a bonding initiator at a center portion of the first supporting plate, and an area sensor on the first supporting plate and configured to detect a propagation state of bonding between the first wafer and the second wafer.

20 Claims, 21 Drawing Sheets

(51) Int. Cl.
  *H01L 23/00* (2006.01)
  *H01L 21/68* (2006.01)
  *H01L 21/687* (2006.01)
  *H01L 21/683* (2006.01)
  *B32B 38/18* (2006.01)

(52) U.S. Cl.
  CPC ........... *B32B 2457/14* (2013.01); *H01L 24/94* (2013.01); *H01L 2224/08145* (2013.01); *H01L 2224/7592* (2013.01); *H01L 2224/75724* (2013.01); *H01L 2224/75725* (2013.01); *H01L 2224/75744* (2013.01); *H01L 2224/75982* (2013.01); *H01L 2224/80908* (2013.01); *H01L 2224/94* (2013.01)

(56) References Cited

U.S. PATENT DOCUMENTS

| | | | |
|---|---|---|---|
| 2002/0034859 A1* | 3/2002 | Takisawa | H01L 21/67092 438/455 |
| 2010/0139836 A1* | 6/2010 | Horikoshi | H01L 21/67092 156/64 |
| 2014/0318683 A1 | 10/2014 | Johnson et al. | |
| 2015/0017782 A1* | 1/2015 | Akiyama | H01L 24/741 438/455 |
| 2015/0044786 A1* | 2/2015 | Huang | H01L 24/94 438/14 |
| 2015/0348933 A1 | 12/2015 | Gaudin | |
| 2016/0155721 A1* | 6/2016 | Sugakawa | H01L 21/67092 438/5 |
| 2016/0258862 A1 | 9/2016 | Shin et al. | |
| 2018/0158796 A1* | 6/2018 | Otsuka | B32B 15/01 |

FOREIGN PATENT DOCUMENTS

| | | |
|---|---|---|
| JP | 2012-042431 A | 3/2012 |
| JP | 5786990 A | 8/2014 |
| JP | 5786990 B2 | 8/2014 |
| JP | 2016-039364 A | 3/2016 |
| JP | 2016-103536 A | 6/2016 |
| JP | 2016-105458 A | 6/2016 |
| JP | 2016-525285 A | 8/2016 |
| KR | 10-1999-0051382 | 12/1997 |
| KR | 10-1419139 | 7/2014 |
| KR | 10-1580206 | 12/2015 |

* cited by examiner

WAFER BONDING APPARATUS AND WAFER BONDING SYSTEM INCLUDING THE SAME

CROSS-REFERENCE TO RELATED APPLICATION

This U.S. non-provisional patent application claims priority under 35 U.S.C. § 119 to Korean Patent Application No. 10-2017-0078588, filed on Jun. 21, 2017, in the Korean Intellectual Property Office, the disclosure of which is hereby incorporated in its entirety by reference.

BACKGROUND

The present inventive concept generally relates to the field of electronics and, more particularly, relates to wafer bonding.

In a semiconductor device manufacturing process, a wafer bonding process for bonding two wafers to each other may be performed. Such a wafer bonding process may be performed to improve the mounting density of a chip in a semiconductor device. For example, a semiconductor module having a structure in which chips are stacked may be advantageous for reducing lengths of wires between chips, for high-speed signal processing, and for improving the mounting density of the chips. In the case of manufacturing a semiconductor module having a stacked chip structure, it may be more productive to bond wafers and separate the wafers into stacked chip units than to bond chips. A wafer bonding process may be performed to facilitate handling of a device wafer by bonding the device wafer to a carrier wafer. The wafer bonding process may be performed by using a direct bonding method in which two wafers are directly bonded without a separate medium. The direct bonding methods may be typically performed by using a wafer bonding apparatus having supporting plates on which substrates are placed and fixed and a pressing device to press the substrates.

SUMMARY

The inventive concept provides a wafer bonding apparatus capable of accurately detecting a bonding state of wafers in a wafer bonding process and a wafer bonding system including the wafer bonding apparatus.

According to some embodiments, there is provided a wafer bonding apparatus including a first supporting plate including a first surface and at least one vacuum groove for vacuum-absorption of a first wafer disposed on the first surface, and a second supporting plate including a second surface facing the first surface. A second wafer is on the second surface. The wafer bonding apparatus includes a bonding initiator on the first supporting plate. The bonding initiator is configured to initiate bonding between the first wafer to the second wafer. The wafer bonding apparatus includes an area sensor disposed on the first supporting plate. The area sensor is configured to detect a propagation state of bonding between the first wafer and the second wafer.

According some embodiments, there is provided a wafer bonding apparatus including a first supporting plate including a first surface and at least one vacuum groove for vacuum-absorption of a first wafer disposed on the first surface, a second supporting plate including a second surface facing the first surface, wherein a second wafer is on the second surface, and a sensor on the first supporting plate and configured to detect a state of bonding between the first wafer and the second wafer by two-dimensionally detecting whether the first wafer is separated from the first surface.

According to some embodiments, there is provided a wafer bonding system including a chamber, a first supporting plate in an upper portion of an interior of the chamber and includes a first surface and at least one vacuum groove configured to vacuum-absorb a first wafer disposed on the first wafer, a second supporting plate in a lower portion of the interior of the chamber, the second supporting plate including a second surface facing the first surface. A second wafer is on the second surface. The wafer bonding system includes a vertical moving apparatus configured to move the first supporting plate up or down, a bonding initiator on the first supporting plate that is configured to press the center portion of the first wafer toward the second wafer to initiate bonding between the first wafer and the second wafer, a vacuum pump configured to supply a vacuum to the vacuum groove of the first supporting plate, a controller configured to control the vertical moving apparatus, the bonding initiator, and/or the vacuum pump, and an area sensor on the first supporting plate that is configured to detect a propagation state of the bonding between the first wafer and the second wafer.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are described in detail in the specification set forth below

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
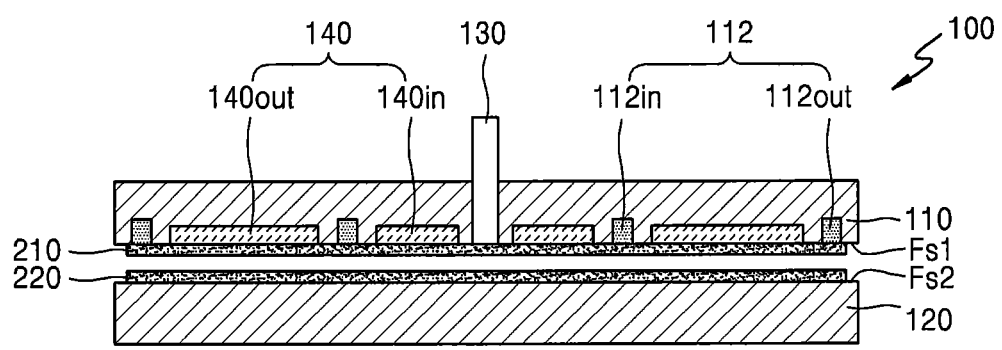
FIG. 1A is a cross-sectional view of a wafer bonding apparatus according to some embodiments of the present inventive concept.
Figure 1B:
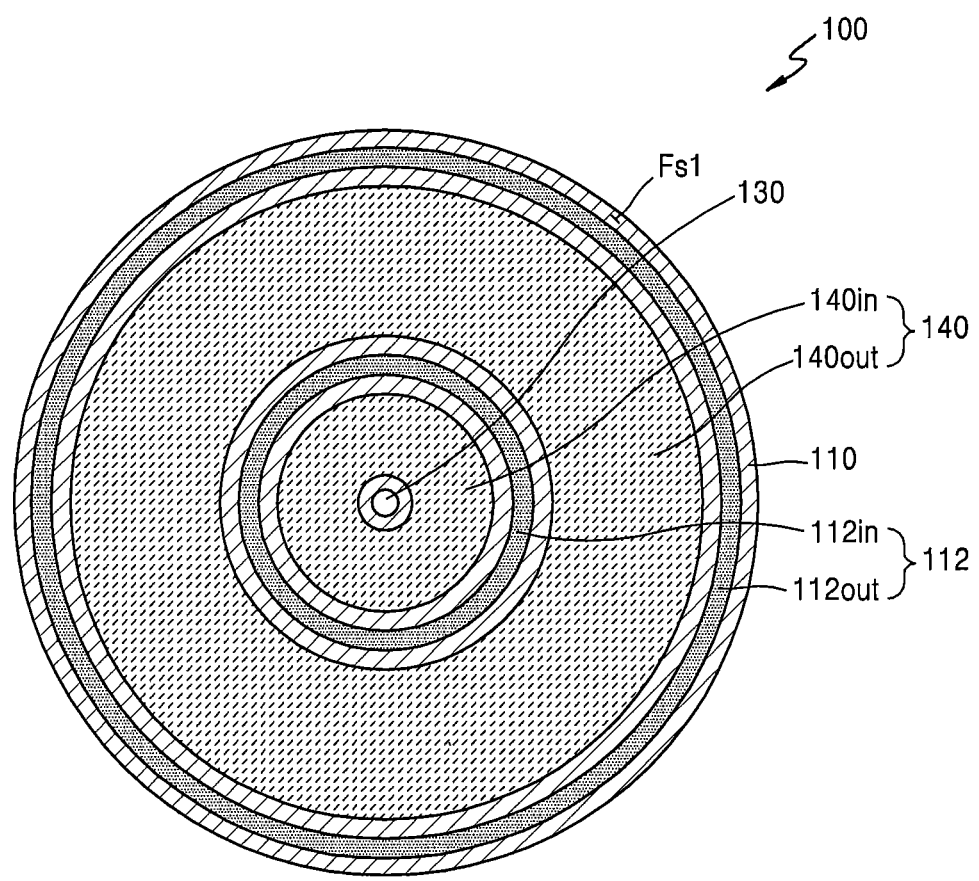
FIG. 1B is a plan view diagram showing the structure of an upper supporting plate and an area sensor on the upper supporting plate in the wafer bonding apparatus of FIG. 1A, according to some embodiments of the present inventive concept.

FIG. 1A is a cross-sectional view of a wafer bonding apparatus according to example embodiments of the present inventive concept, and FIG. 1B is a plan view diagram showing the structure of an upper supporting plate and an area sensor on the upper supporting plate in the wafer bonding apparatus of FIG. 1A.

Referring to FIGS. 1A and 1B, a wafer bonding apparatus 100 according to the present embodiment includes an upper supporting plate 110, a lower supporting plate 120, a bonding initiator 130, and an area sensor 140.

The upper supporting plate 110 is a structure on which a first wafer 210 to be bonded is disposed and fixed and may be referred to as an upper chuck. A surface of the upper supporting plate 110, that is, a bottom surface Fs1, faces downward, and vacuum grooves 112 may be formed on the bottom surface Fs1, as shown in FIG. 1B.

The vacuum grooves 112 may have an annular shape and may include an inner vacuum groove 112in formed adjacent to a center portion of the upper supporting plate 110 and an outer vacuum groove 112out formed adjacent to an outer portion of the upper supporting plate 110. In the wafer bonding apparatus 100, according to some embodiments, although two vacuum grooves 112 are formed on the bottom surface Fs1 of the upper supporting plate 110, the number of the vacuum grooves 112 is not limited thereto. For example, only one vacuum groove 112 may be formed on the bottom surface Fs1 of the upper supporting plate 110, or three or more vacuum grooves 112 may be formed in some embodiments. In the wafer bonding apparatus 100 according to the present embodiment, although the vacuum grooves 112 have an annular shape, the shape of the vacuum grooves 112 is not limited thereto. The shape of the vacuum grooves 112 will be described below in more detail with reference to FIG. 2A.

Figure 8:
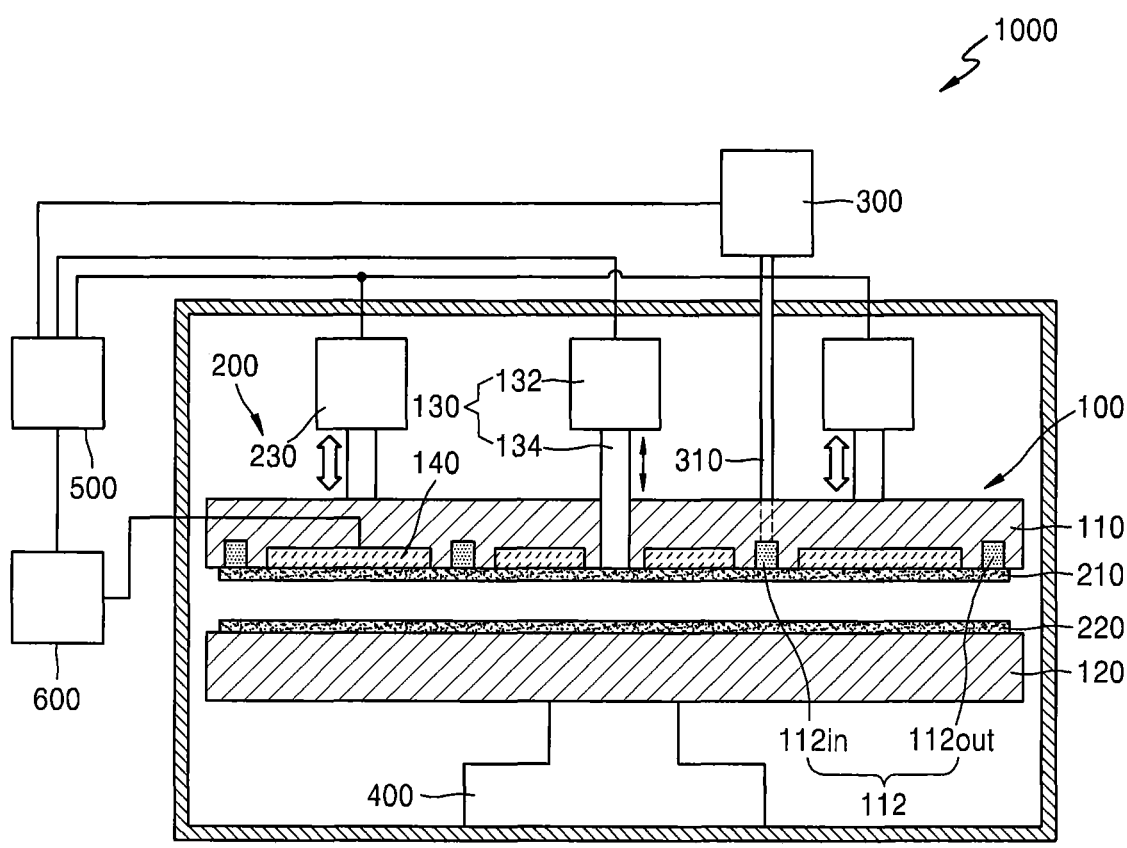
FIG. 8 is a schematic diagram of a wafer bonding system including the wafer bonding apparatus of FIG. 1A, according to some embodiments of the present inventive concept.

The vacuum grooves 112 may be connected to a vacuum pump (see 300 of FIG. 8) through an inside pipeline formed inside the upper supporting plate 110 and an outside pipeline outside the upper supporting plate 110 (see 310 in FIG. 8). The inner vacuum groove 112in and the outer vacuum groove 112out may be connected to each other through the inside pipeline and may be connected to the vacuum pump 300 together or may be connected to the vacuum pump 300 independently without being connected to each other. As the vacuum pump 300 is operated and vacuum adsorption by the vacuum grooves 112 proceeds, the first wafer 210 may be adsorbed and fixed onto the bottom surface Fs1 of the upper supporting plate 110.

The lower supporting plate 120 is a structure on which a second wafer 220 to be bonded is disposed and/or fixed and may be referred to as a lower chuck. The lower supporting plate 120 may be spaced apart from the upper supporting plate 110 by a distance. A surface of the lower supporting plate 120, that is, a top surface Fs2, faces upward, and the second wafer 220 may be disposed on the top surface Fs2.

The second wafer 220 may be fixed to the lower supporting plate 120 in various ways. For example, vacuum grooves similar to that of the upper supporting plate 110 may be formed in the lower supporting plate 120, and/or the second wafer 220 may be fixed to the lower supporting plate 120 through vacuum absorption using the vacuum grooves in the lower supporting plate 120. In the wafer bonding apparatus 100 according to some embodiments, a method of fixing the second wafer 220 to the lower supporting plate 120 is not limited to vacuum adsorption. For example, the second wafer 220 may be fixed to the lower supporting plate 120 via a static force (e.g., by using an electrostatic chuck). Furthermore, the second wafer 220 may be fixed to the lower supporting plate 120 by using a physical fixing device, such as a lift pin or a holder. An electrostatic chuck may be used for affixing the first wafer 210 to the upper supporting plate 110.

The bonding initiator 130 may be disposed at the center portion of the upper supporting plate 110 and penetrate through the upper supporting plate 110. Although FIG. 1A shows the bonding initiator 130 in the form of a long cylindrical bar, this form is a simplification in consideration of functional aspects of the bonding initiator 130. The overall structure of the bonding initiator 130 will be described below in more detail with reference to FIG. 8.

The bonding initiator 130 may press a center portion of the first wafer 210 fixed on the bottom surface Fs1 of the upper supporting plate 110 to move the center portion of the first wafer 210 downward. As a result, the center portion of the first wafer 210 starts bonding to a center portion of the second wafer 220, and then the bonding may propagate toward outer portions of the first wafer 210 and the second wafer 220. As the bonding propagates, the first wafer 210 is separated from the bottom surface Fs1 of the upper supporting plate 110. Similar to the propagation of the bonding, the separation of the first wafer 210 may propagate from the center portion of the first wafer 210 toward the outer portion of the first wafer 210. However, the vacuum absorption with respect to the first wafer 210 may be stopped during the propagation of the bonding. If the vacuum absorption is maintained, the propagation of the bonding or the propagation of the separation of the first wafer 210 may stop at the vacuum grooves 112. According to some embodiments, in a case where the vacuum adsorption is maintained, when the bonding force between wafers is greater than a vacuum absorption force, the propagation of the bonding or the propagation of the separation of the first wafer 210 may not stop. The propagation of the bonding and the propagation of the separation of the first wafer 210 will be described below in more detail with reference to FIGS. 3A through 4B.

The area sensor 140 may be a buried structure below the bottom surface Fs1 of the upper supporting plate 110. The area sensor 140 may be disposed at a portion where the vacuum grooves 112 are not formed. Therefore, the area sensor 140 may have an annular shape and may be disposed at portions outside portions corresponding to the vacuum grooves 112. The area sensor 140 may include an inner portion 140in and an outer portion 140out. Both the inner portion 140in and the outer portion 140out may have annular shapes with certain widths. A width may be a width in a radial direction. The area sensor 140 may refer to a two-dimensional sensor that two-dimensionally detects a physical change of an exposed surface.

The area sensor 140 may be a touch sensor to which any one of a resistive mechanism, a capacitive mechanism, an infrared ray (IR) mechanism, and a surface acoustic wave (SAW) mechanism may be applied. Here, the resistive mechanism, the SAW mechanism, and/or the IR mechanism are mechanisms using pressure, and the capacitive mechanism is a mechanism using electrostatic properties. Specifically, the resistance mechanism includes detection of a signal when an upper layer and a lower layer physically contact each other due to physical pressure. The SAW mechanism and the infrared mechanism are distinguished from each other based on whether an acoustic wave or an infrared ray is applied to a surface. In the case of the SAW mechanism, the surface includes a glass material, thereby exhibiting excellent durability, stable operation without fluctuation, and/or a fast or sensitive touch response. The capacitive mechanism is a mechanism for applying voltages from multiple directions and calculating or recognizing the location of a waveform deformed by physical contact or by physical pressure. Since the capacitive mechanism may be responsive to a smaller voltage as compared with the resistive mechanism, the capacitive mechanism may exhibit higher detection efficiency. In some embodiments, a principle which may be applied to the area sensor 140 of the wafer bonding apparatus 100 may be opposite to that of an existing touch sensor in which a portion which is touched is detected in a state where the entire touch sensor is separated from a surface to be touched. In other words, a principle in which a separated portion of a touch sensor that is separated is detected in a state where the entire touch sensor is contacting a surface to be separated may be applied to the area sensor 140 of the wafer bonding apparatus 100 according to the present embodiment. For example, in the wafer bonding apparatus 100, according to some embodiments, the area sensor 140 may detect portions of the upper supporting plate 110 where the first wafer 210 is separated from the bottom surface Fs1 of the upper supporting plate 110.

In the wafer bonding apparatus 100 according to some embodiments, the mechanisms by which the area sensor 140 detects a separation of the first wafer 210 are not limited to the mechanisms described above. In other words, as long as a separation of the first wafer 210 from the bottom surface Fs1 of the upper supporting plate 110 may be two-dimensionally detected, any detecting mechanism may be applied to the area sensor 140 of the wafer bonding apparatus 100 according to some embodiments. For example, a distance sensor using an ultrasonic wave, a laser, an infrared ray, or the like, or a vision sensor, a vacuum sensor, a pressure sensor, or a piezoelectric sensor, may be applied to the area sensor 140 of the wafer bonding apparatus 100, according to some embodiments.

The principle of detecting a wafer bonding state in the wafer bonding apparatus 100 according to the present embodiment will be briefly described below. First, the first wafer 210 and second wafer 220 may be disposed and fixed on the upper supporting plate 110 and the lower supporting plate 120, respectively. Next, as the center portion of the first wafer 210 is pressed downward by the bonding initiator 130 and separated from the upper supporting plate 110, the center portion of the first wafer 210 may start bonding to the center portion of the second wafer 220. The bonding may then propagate toward the outer portions of the first wafer 210 and the second wafer 220, and the propagation of this bonding may be detected by the area sensor 140 disposed in the upper supporting plate 110. By detecting the propagation of the bonding through the area sensor 140 with certain rules, it may be determined whether a wafer bonding state is normal. On the other hand, as the bonding propagates, vacuum adsorption by the vacuum grooves 112 may be stopped sequentially. The propagation of the bonding and the stopping of the vacuum adsorption will be described below in more detail with reference to FIGS. 3A through 4B. Furthermore, the detection of the bonding by the area sensor 140 and the determination of whether a wafer bonding state is normal will be described below in more detail with reference to FIGS. 5A through 7E.

The wafer bonding apparatus 100 according to the present embodiment may two-dimensionally detect a state of the propagation of the bonding between the first wafer 210 and the second wafer 220 by using the area sensor 140 disposed in the upper supporting plate 110 during the wafer bonding process, thereby detecting a bonding state between the first wafer 210 and the second wafer 220. Furthermore, the wafer bonding apparatus 100 according to some embodiments may detect a relatively accurate location at which a defect has occurred, a location nearby a defect, or an area in which a defect has occurred by using a result detected by the area sensor 140 when the bonding state between the first wafer 210 and the second wafer 220 is determined as abnormal.

The wafer bonding apparatus 100 according to some embodiments may accurately detect a wafer bonding state and a location of a defect by using the area sensor 140, thereby controlling an operation of equipment during a wafer bonding process. As a result, the yield of the wafer bonding process may be significantly increased through precise controlling of the operation of equipment during water bonding.

FIGS. 2A through 2D are plan view diagrams showing other structures of an upper supporting plate and an area sensor disposed in the upper supporting plate in the wafer bonding apparatus of FIG. 1A, and are plan view diagrams corresponding to FIG. 1B. Descriptions already given above with reference to FIGS. 1A and 1B will be briefly presented or omitted for brevity.

Figure 2A:
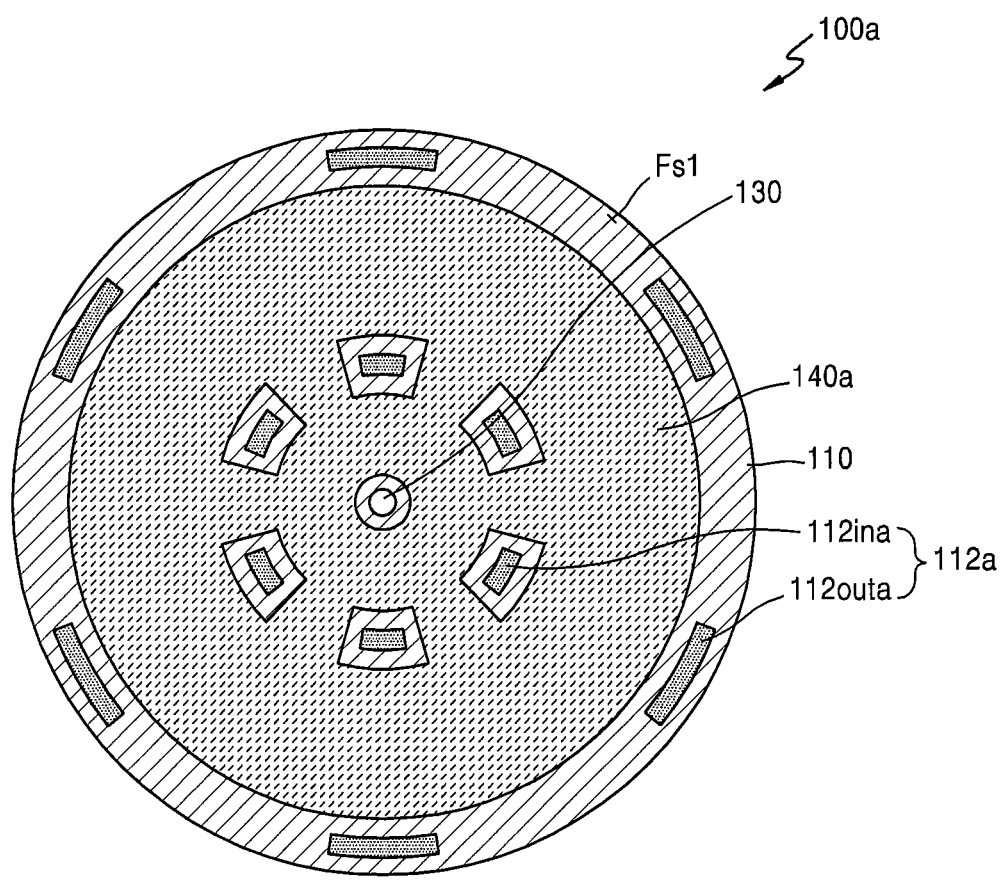
FIGS. 2A through 2D are plan view diagrams showing other structures of an upper supporting plate and an area sensor on the upper supporting plate in the wafer bonding apparatus of FIG. 1A, according to some embodiments of the present inventive concept.

Referring to FIG. 2A, a wafer bonding apparatus 100a according to the present embodiment may be different from the wafer bonding apparatus 100 of FIG. 1B for the structure of a vacuum groove 112a formed in the upper supporting plate 110 and the structure of an area sensor 140a based on the structure of the vacuum groove 112a. In detail, in the wafer bonding apparatus 100 of FIG. 1B, the vacuum groove 112 has a structure including the inner groove 112in and the outer vacuum groove 112out having annular shapes. However, in the wafer bonding apparatus 100a of FIG. 2A, the vacuum groove 112a may have a structure including a plurality of inner vacuum grooves 112in *a* and a plurality of outer vacuum grooves 112out*a* arranged in radial directions.

In the wafer bonding apparatus 100a of FIG. 2A, although the vacuum grooves 112a are arranged in radial directions, arrangements of the vacuum grooves 112a are not limited thereto. For example, the vacuum grooves 112a may be arranged in the form of sides of a polygon. Furthermore, the vacuum grooves 112a may be freely arranged without any rules, and the number of the vacuum grooves 112a may vary. Furthermore, the shape of a horizontal cross-section of each of the vacuum grooves 112a is not limited to a long rectangle or an arc, but may be a circle, an ellipse, or a polygon.

In the wafer bonding apparatus 100a of FIG. 2A, the area sensor 140a may have an integrated structure without a distinction between an inner portion and an outer portion. In other words, in the wafer bonding apparatus 100 of FIG. 1B, since the inner vacuum groove 112in is formed to have a annular shape, the area sensor 140 has a structure separated into the inner portion 140in and the outer portion 140out by the inner vacuum groove 112in. However, in the wafer bonding apparatus 100a of FIG. 2A, the area sensor 140a may have a structure in which the area sensor 140a has an integrated structure based on the structure of the inner vacuum grooves 112in a spaced apart from one another.

Meanwhile, in the wafer bonding apparatus 100a according to some embodiments, the area sensor 140a may have a structure that further extends outward between the outer vacuum grooves 112outa. The area sensor 140a of the wafer bonding apparatus 100a may have a structure in which the inner portion and the outer portion of the area sensor 140a are separated from each other like the structure of the area sensor 140 of the wafer bonding apparatus 100 of FIG. 1B.

Figure 2B:
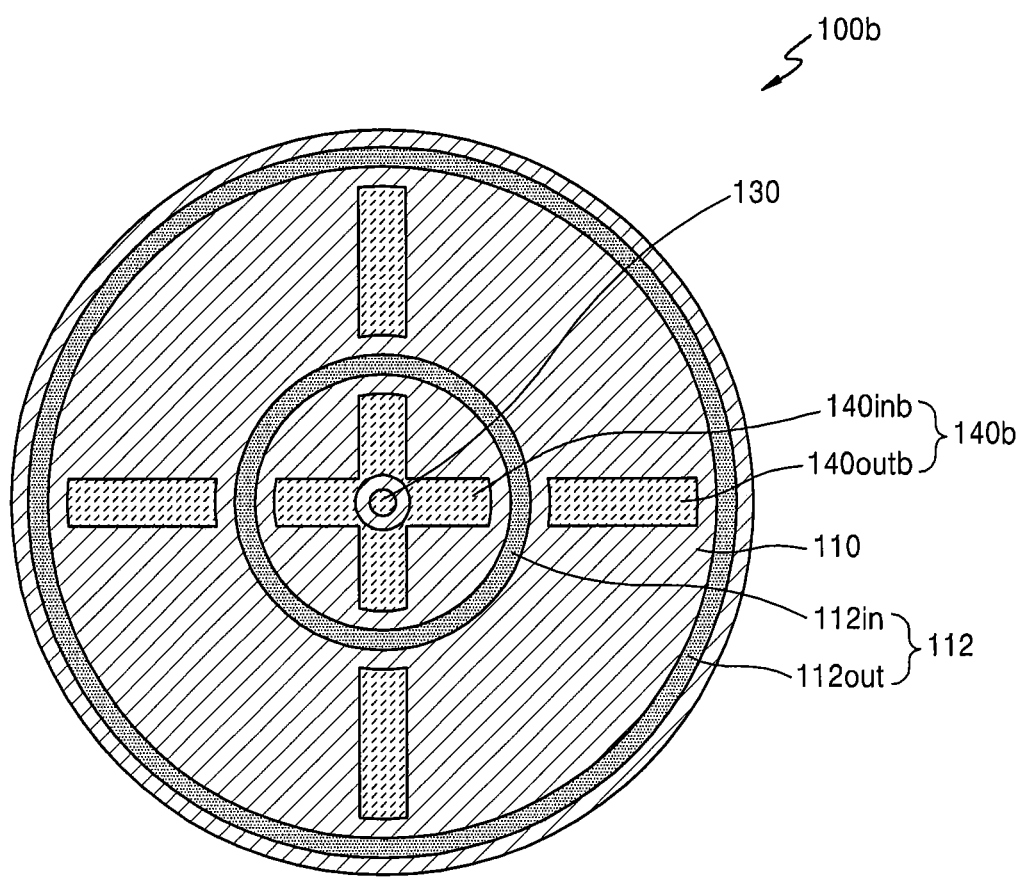

Referring to FIG. 2B, a wafer bonding apparatus 100b according to some embodiments may be different from the wafer bonding apparatus 100 of FIG. 1B for the structure of an area sensor 140b. Specifically, in the wafer bonding apparatus 100 of FIG. 1B, the area sensor 140 has a structure including the inner portion 140in and the outer portion 140out having annular shapes. However, the area sensor 140b may have a structure including an inner portion 140in b having a cross-like shape and an outer portion 140outb disposed in a radial shape in correspondence to the inner portion 140in b, as illustrated in FIG. 2B.

In the wafer bonding apparatus 100b according to some embodiments, the reason that the area sensor 140b has a cross-like radial structure may be to detect whether propagation of wafer bonding proceeds two-dimensionally and/or point-symmetrically. In the wafer bonding apparatus 100b of FIG. 2B, the structure of the area sensor 140b is not limited to the cross-like radial structure and may be one of various radial structures. For example, in the wafer bonding apparatus 100b according to some embodiments, the area sensor 140b may include the inner portion 140in b and the outer portion 140outb constituting a radial structure that proceeds from the center of a polygon, such as a regular triangle or a regular hexagon, to vertices of the polygon.

Figure 2C:
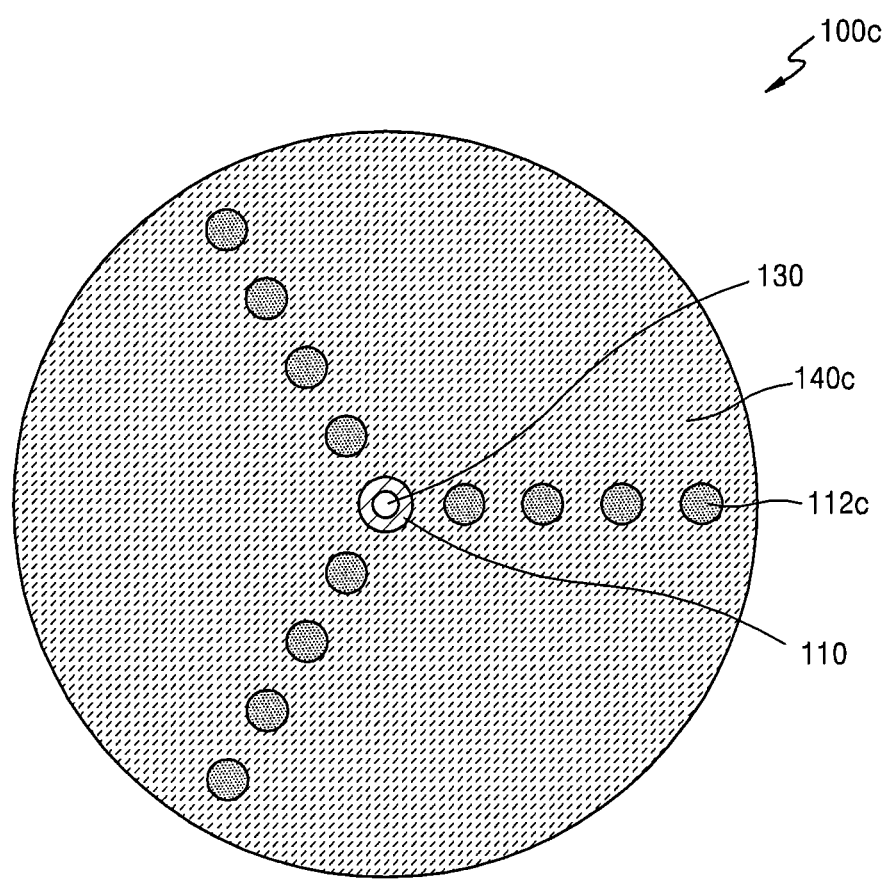

Referring to FIG. 2C, a wafer bonding apparatus 100c according to the present embodiment may be different from the wafer bonding apparatus 100 of FIG. 1B with respect to the structure of vacuum grooves 112c formed in the upper supporting plate 110 and the structure of an area sensor 140c based on the vacuum grooves 112c. Specifically, in the wafer bonding apparatus 100 of FIG. 1B, the vacuum grooves 112 have a structure including the inner vacuum groove 112in and the outer vacuum groove 112out having annular shapes. However, in the wafer bonding apparatus 100c of FIG. 2C, a plurality of vacuum grooves 112c may have a structure in which the plurality of vacuum grooves 112c are arranged in three rows in an outward direction from the center of the upper supporting plate 110 with a central angle therebetween, e.g., a central angle of 120 degrees. The central angle is not limited to the example of 120 degrees and may thus vary. For example, the plurality of vacuum grooves 112c may be arranged in four rows in an outward direction with a central angle of 90 degrees. Furthermore, although four vacuum grooves 112c are arranged per row, the number of the vacuum grooves 112c per row is not limited to four.

The area sensor 140c may be disposed on an entire surface of the upper supporting plate 110 except for portions corresponding to the bonding initiator 130 and the vacuum grooves 112c. Although the upper supporting plate 110 is slightly exposed outside the bonding initiator 130 in FIG. 2C, the upper supporting plate 110 may also be slightly exposed outside the vacuum grooves 112c.

The structures of the vacuum grooves 112, 112a, and 112c formed in the upper supporting plate 110 and the structures of the area sensors 140, 140a, 140b, and 140c have been described above. However, the structures of the vacuum grooves 112, 112a, and 112c and the structures of the area sensors 140, 140a, 140b, and 140c are not limited thereto. For example, a vacuum groove may be formed to have one of various structures for fixing the first wafer 210 via suitable vacuum absorption and sequentially stopping vacuum adsorption to the first wafer 210 in an outward direction during a wafer bonding process. Furthermore, an area sensor may have one of various structures capable of two-dimensionally and/or point-symmetrically detecting the propagation of wafer bonding during a wafer bonding process, that is, the propagation of separation of the first wafer 210.

Figure 2D:
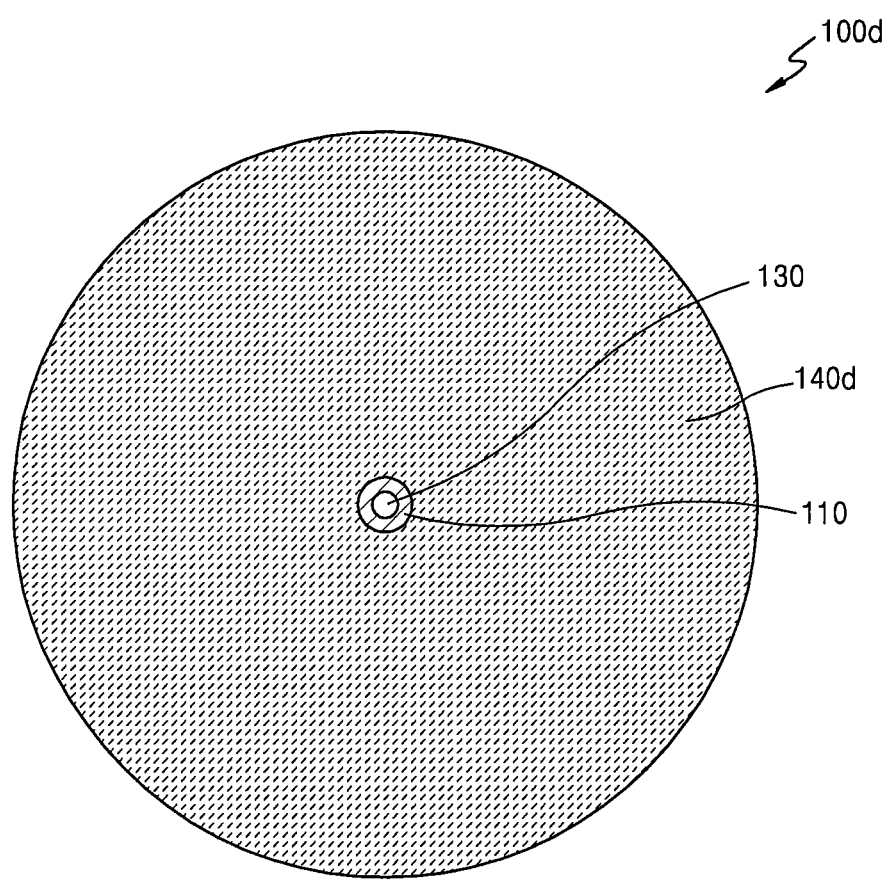

Referring to FIG. 2D, a wafer bonding apparatus 100d according to some embodiments may be different from the wafer bonding apparatus 100 of FIG. 1B in that the upper supporting plate 110 may not have vacuum grooves. Specifically, in the wafer bonding apparatus 100d according to some embodiments, no vacuum grooves are formed in the upper supporting plate 110, and an area sensor 140d may be disposed on an entire surface of the upper supporting plate 110 except for a portion corresponding to the bonding initiator 130. For example, in the wafer bonding apparatus 100d of FIG. 2D, an electrostatic chuck may be applied to the upper supporting plate 110. Therefore, the upper supporting plate 110 may fix the first wafer 210 by using electrostatic force, and thus no vacuum grooves may be formed in the upper supporting plate 110.

FIGS. 3A through 3D are cross-sectional view diagrams showing a wafer bonding process proceeding in the wafer bonding apparatus of FIG. 1A, according to some embodiments of the inventive concept.

Figure 3A:
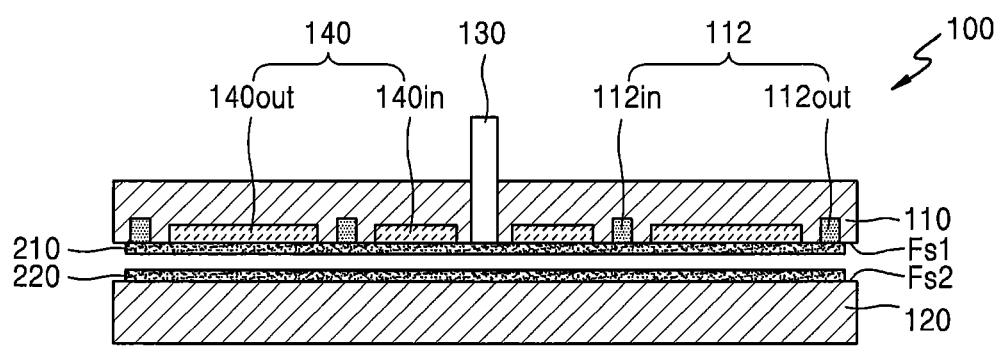
FIGS. 3A through 3D are cross-sectional view diagrams showing a wafer bonding process in the wafer bonding apparatus of FIG. 1A, according to some embodiments of the present inventive concept.

Referring to FIG. 3A, the first wafer 210 may be vacuum-adsorbed and fixed onto the bottom surface Fs1 of the upper supporting plate 110. Furthermore, the second wafer 220 may be disposed and fixed on the top surface Fs2 of the lower supporting plate 120. The second wafer 220 may be fixed to the lower supporting plate 120 in various ways, for example, by using vacuum adsorption, electrostatic force, and/or physical devices, as described above.

Figure 3B:
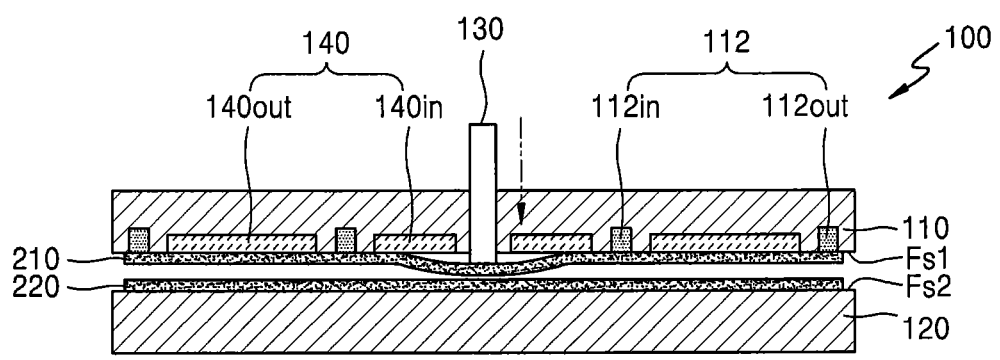

Referring to FIG. 3B, the center portion of the first wafer 210 is pressed downward by using the bonding initiator 130, thereby separating the center portion of the first wafer 210 from the bottom surface Fs1 of the upper supporting plate 110. A separation distance by which the first wafer 210 is separated from the bottom surface Fs1 of the upper supporting plate 110 may vary according to a location of the inner vacuum groove 112in. For example, when the inner vacuum groove 112in is formed at a location close to the center portion of the first wafer 210, the separation distance of the first wafer 210 may be relatively small. On the other hand, when the inner vacuum groove 112in is formed at a location relatively far from the center portion of the first wafer 210, the separation distance of the first wafer 210 may be relatively large. This behavior may occur since the vacuum absorption by the inner vacuum groove 112in may interfere with the separation of the first wafer 210 from the bottom surface Fs1 of the upper supporting plate 110, pressing by the bonding initiator 130 is performed but may be limited so as not to damage the first wafer 210, according to a location of the inner vacuum groove 112in. The pressing by the bonding initiator 130 may be performed by pressing a center portion of the first wafer 210 towards the second wafer 220.

Furthermore, when the inner vacuum groove 112in is formed relatively far from the center portion of the first wafer 210, the center portion of the first wafer 210 may be pressed by the bonding initiator 130 and contact the center portion of the second wafer 220, and thus substantial bonding may be initiated.

Figure 3C:
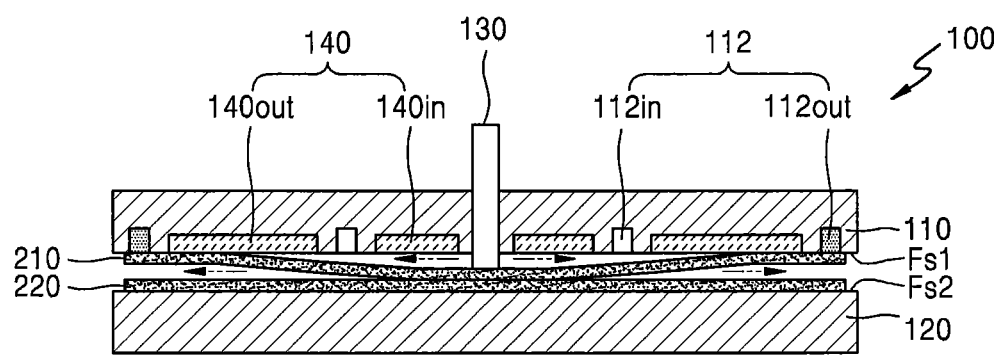

Referring to FIG. 3C, after the first wafer 210 is pressed by the bonding initiator 130, the vacuum absorption of the inner vacuum groove 112in may be stopped. Therefore, the bonding between the first wafer 210 and the second wafer 220 may propagate from the center portions of the first wafer 210 and the second wafer 220 to the outer portions thereof. The propagation of the bonding between the first wafer 210 and the second wafer 220 may be similar phenomenon as propagation of separation of the first wafer 210 from the bottom surface Fs1 of the upper supporting plate 110, from the center portion of the first wafer 210 to the outer portion thereof. For example, bonding between insulating films, such as oxide films, is referred to as direct bonding. In direct bonding, the first wafer 210 may be separated from the upper supporting plate 110 and propagate by spontaneous bonding force. In FIG. 3C, a hatched pattern is omitted from the inner vacuum groove 112in, in order to distinguish the state in which the vacuum absorption of the inner vacuum groove 112in is stopped from the state in which the vacuum absorption of the outer vacuum groove 112out is maintained. Moreover, as shown in FIG. 3D, when an electrostatic chuck is used as the upper supporting plate 110, the first wafer 210 may spontaneously separate from the upper supporting plate 110 after the bonding initiator 130 is operated while a constant voltage is maintained.

On the other hand, when the inner vacuum groove 112in is located close to the center portion of the first wafer 210, and bonding between the first wafer 210 and the second wafer 220 could not be initiated as the center portion of the first wafer 210 is pressed by the bonding initiator 130, the center portion of the first wafer 210 may be further pressed by the bonding initiator 130 after the vacuum absorption of the inner vacuum groove 112in is stopped, and thus bonding may be initiated. Later, the bonding between the first wafer 210 and the second wafer 220 may propagate.

Figure 3D:
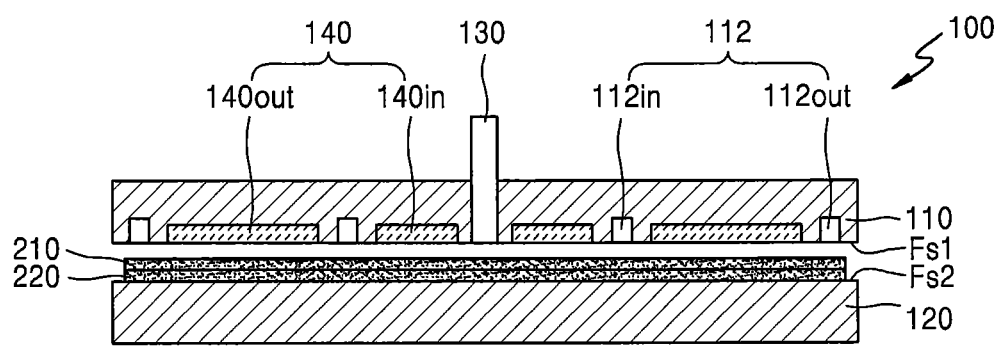

Referring to FIG. 3D, when the propagation of the bonding between the first wafer 210 and the second wafer 220 reaches the outer portions of the first wafer 210 and the second wafer 220, the vacuum adsorption is stopped at the outer vacuum groove 112out of the upper supporting plate 110. The outer portions of the first wafer 210 and the second wafer 220 are bonded to each other as the vacuum absorption of the outer vacuum groove 112out is stopped, and the propagation of the bonding between the first wafer 210 and the second wafer 220 may be terminated. The termination of the propagation of the bonding between the first wafer 210 and the second wafer 220 may be considered as completion of the bonding between the first wafer 210 and the second wafer 220. The termination of the bonding propagation between the first wafer 210 and the second wafer 220 may be the same phenomenon as the complete separation of the first wafer 210 from the bottom surface Fs1 of the upper supporting plate 110. According to some embodiments, the vacuum adsorption may be stopped at the outer vacuum groove 112out before the propagation of the bonding between the first wafer 210 and the second wafer 220 reaches the outer portions of the first wafer 210 and the second wafer 220.

Figure 4A:
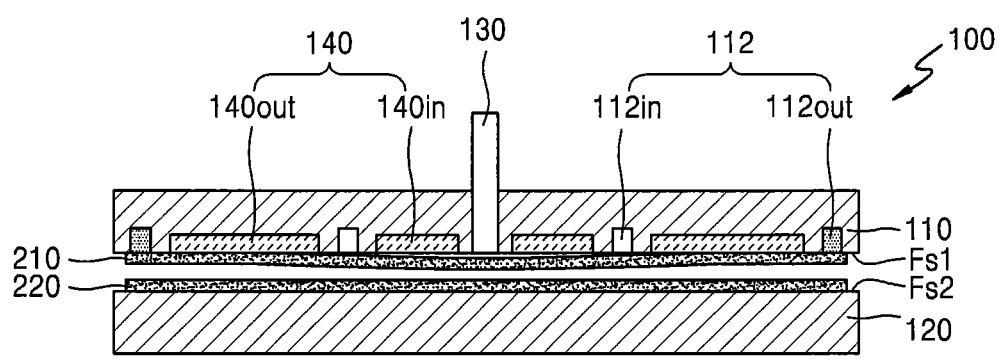
FIGS. 4A and 4B are cross-sectional diagrams showing a wafer bonding process in the wafer bonding apparatus of FIG. 1A, according to some embodiments of the present inventive concept.
Figure 4B:
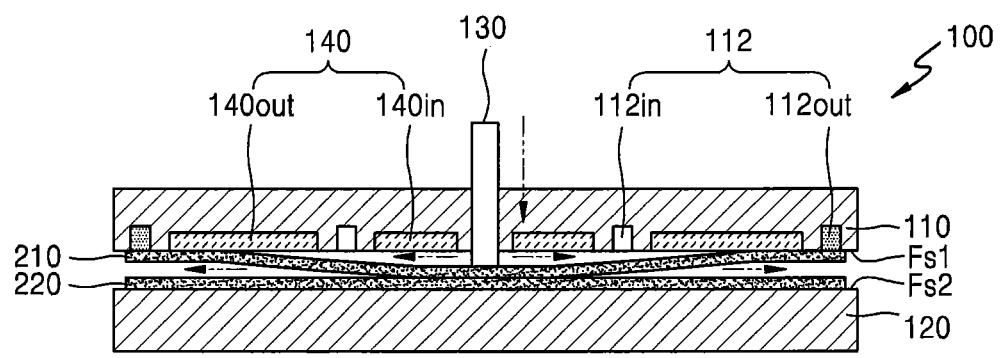

FIGS. 4A and 4B are cross-sectional diagrams showing a wafer bonding process in the wafer bonding apparatus of FIG. 1A, according to some embodiments of the inventive concept. Descriptions provided above with reference to FIGS. 3A through 3D are briefly provided again below or omitted below.

Referring to FIG. 4A, first, as described above with reference to FIG. 3A, the first wafer 210 is disposed and fixed on the bottom surface Fs1 of the upper supporting plate 110, and the second wafer 220 is disposed and fixed on the top surface Fs2 of the lower supporting plate 120. Next, vacuum absorption is stopped at the inner vacuum groove 112in of the upper supporting plate 110. As the vacuum absorption of the inner vacuum groove 112in is stopped, the center portion of the first wafer 210 may be slightly separated from the bottom surface Fs1 of the upper supporting plate 110. However, according to some embodiments, the center portion of the first wafer 210 may still be attached to the bottom surface Fs1 of the upper supporting plate 110 even after the vacuum absorption of the inner vacuum groove 112in is stopped.

Referring to FIG. 4B, after the vacuum absorption of the inner vacuum groove 112in is stopped, the center portion of the first wafer 210 is pressed downward by using the bonding initiator 130, such that the center portion is separated from the bottom surface Fs1 of the upper supporting plate 110. Furthermore, when the center portion of the first wafer 210 is already separated from the bottom surface Fs1 of the upper supporting plate 110, the center portion of the first wafer 210 is further separated from the bottom surface Fs1 of the upper supporting plate 110 due to the pressing of the bonding initiator 130.

Still referring to FIG. 4B, by being pressed by the bonding initiator 130, the center portion of the first wafer 210 may contact the center portion of the second wafer 220, and thus bonding may be initiated. Next, the bonding between the first wafer 210 and the second wafer 220 may then propagate from the center portions to the outer portions thereof. As described above, the propagation of the bonding between the first wafer 210 and the second wafer 220 is the same phenomenon as propagation of the separation of the first wafer 210 from the bottom surface Fs1 of the upper supporting plate 110.

Next, as described above with reference to FIG. 3D, when the propagation of the bonding between the first wafer 210 and the second wafer 220 reaches the outer portions of the first wafer 210 and the second wafer 220, vacuum adsorption is stopped at the outer vacuum groove 112out of the upper supporting plate 110. Therefore, the outer portions of the first wafer 210 and the second wafer 220 may be bonded to each other, and thus the bonding between the first wafer 210 and the second wafer 220 may be complete.

The difference between the wafer bonding process in FIGS. 3A through 3D and the wafer bonding process in FIGS. 4A and 4B is whether the pressing by the bonding initiator 130 or the stopping of the vacuum absorption at the inner vacuum groove 112in is performed first. One of the two types of bonding operations may be selected according to shapes and locations of the vacuum grooves 112 formed in the upper supporting plate 110. Moreover, according to some embodiments, the pressing by the bonding initiator 130 and the stopping of the vacuum absorption at the inner vacuum groove 112in may be performed simultaneously.

Furthermore, although descriptions have been given above with reference to FIG. 3A through FIG. 4B in relation to the vacuum grooves 112 having a structure including the inner vacuum groove 112in and the outer vacuum groove 112out, the vacuum grooves 112 may, for example, include two or more inner vacuum grooves formed sequentially from the center of the upper supporting plate 110. Even when the vacuum grooves 112 have such a structure, vacuum absorption by the vacuum grooves 112 may be stopped sequentially in a direction from the center portions of the first wafer 210 to the outer portions thereof.

Figure 5A:
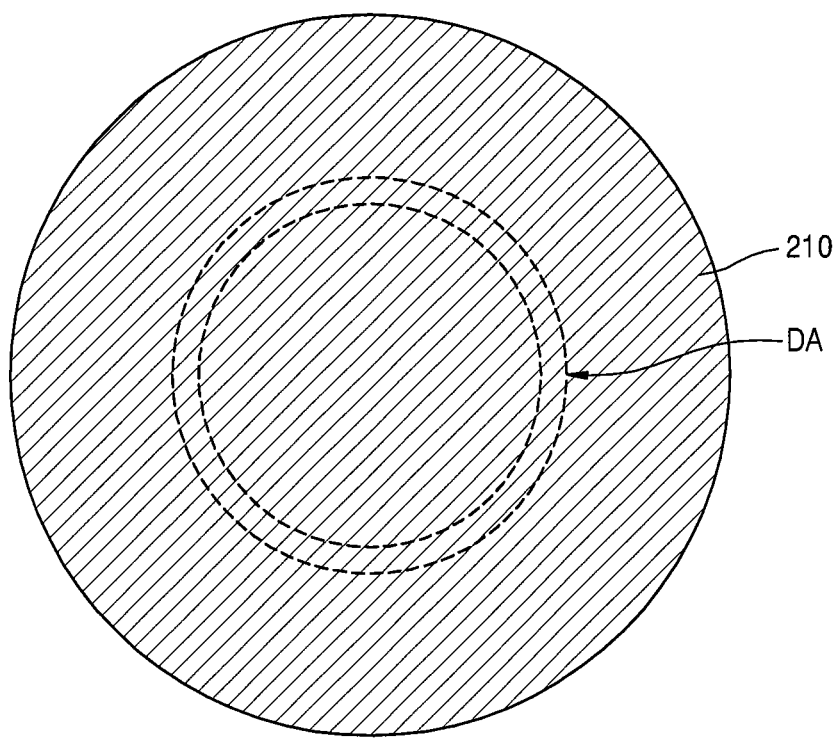
FIGS. 5A and 5B are plan views of a determining area defined on a first wafer in the wafer bonding apparatus of FIG. 1A, according to some embodiments of the present inventive concept.
Figure 5B:
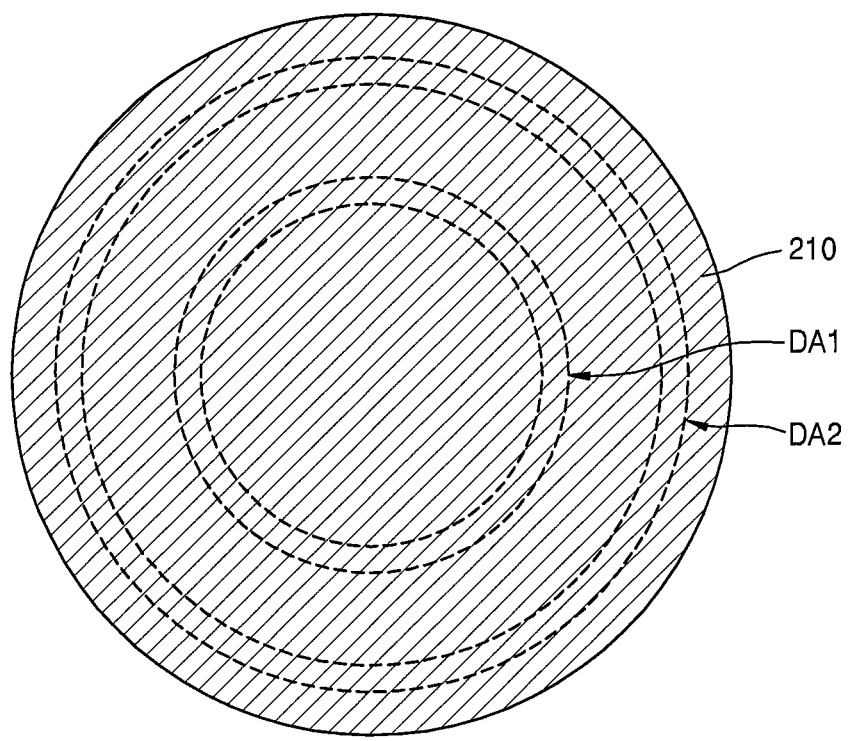

FIGS. 5A and 5B are plan views of a determining area defined on a first wafer in the wafer bonding apparatus of FIG. 1A, and are plan view diagrams corresponding to FIG. 1B.

Referring to FIG. 5A, in the wafer bonding apparatus 100 according to the present embodiment, one determining area DA may be defined on the first wafer 210 disposed on the bottom surface Fs1 of the upper supporting plate 110. The determining area DA may be defined such that it is included in an area in which the area sensor 140, e.g., the outer portion 140out of the area sensor 140, is included. The determining area DA may be defined so as to check whether the bonding of the first wafer 210 and the second wafer 220 or the separation of the first wafer 210 from the bottom surface Fs1 of the upper supporting plate 110 is propagating normally in terms of time and/or location. For example, when the bonding between the first wafer 210 and the second wafer 220 proceeds normally, the determining area DA may be defined as an area that may include an average outer boundary of the bonding at a set first time point t1 after the propagation of bonding is initiated. In some embodiments, at least one circular determining area around a center portions of the first wafer 210 may be defined.

Referring to FIG. 5B, in the wafer bonding apparatus 100 according to the present embodiment, two determination areas DA1 and DA2 may be defined on the first wafer 210 disposed on the bottom surface Fs1 of the upper supporting plate 110. For example, a first determining area DA1 may be defined on the inner portion of the first wafer 210 and a second determining area DA2 may be defined on the outer portion of the first wafer 210. The first determining area DA1 may be identical to or different from the determining area DA in FIG. 5A. The first determining area DA1 and the second determining area DA2 may be defined such that they are included in an area in which the outer portion 140out of the area sensor 140 is disposed. However, the locations of the first determining area DA1 and the second determining area DA2 are not limited thereto. For example, the first determining area DA1 may be defined in an area in which the inner portion 140in of the area sensor 140 is disposed, whereas the second determining area DA2 may be defined in the area in which the outer portion 140out of the area sensor 140 is disposed.

The first determining area DA1 and the second determining area DA2 may also be defined so as to check whether the bonding of the first wafer 210 and the second wafer 220 or the separation of the first wafer 210 from the bottom surface Fs1 of the upper supporting plate 110 is propagating normally in terms of time and/or location. For example, the first determining area DA1 may be defined as an area that may include an average outer boundary of the bonding at a set first time point t1, whereas the second determining area DA2 may be defined as an area that may include an average outer boundary of the bonding at a set second time point t2. In some embodiments, the second time point t2 may occur later than the first time point t1.

Although the one determining area DA is identified in FIG. 5A and the two determining areas DA1 and DA2 are identified in FIG. 5B, the number of determining areas is not limited thereto. For example, three or more determination areas may be identified. Furthermore, although FIGS. 5A and 5B show that the determining areas DA, DA1, and DA2 are defined such that they each have an annular shape, the shape of a determining area is not limited thereto. For example, a determining area may include a plurality of radially spreading portions similar to the structure of the vacuum grooves 112a of FIG. 2A.

Figure 6:
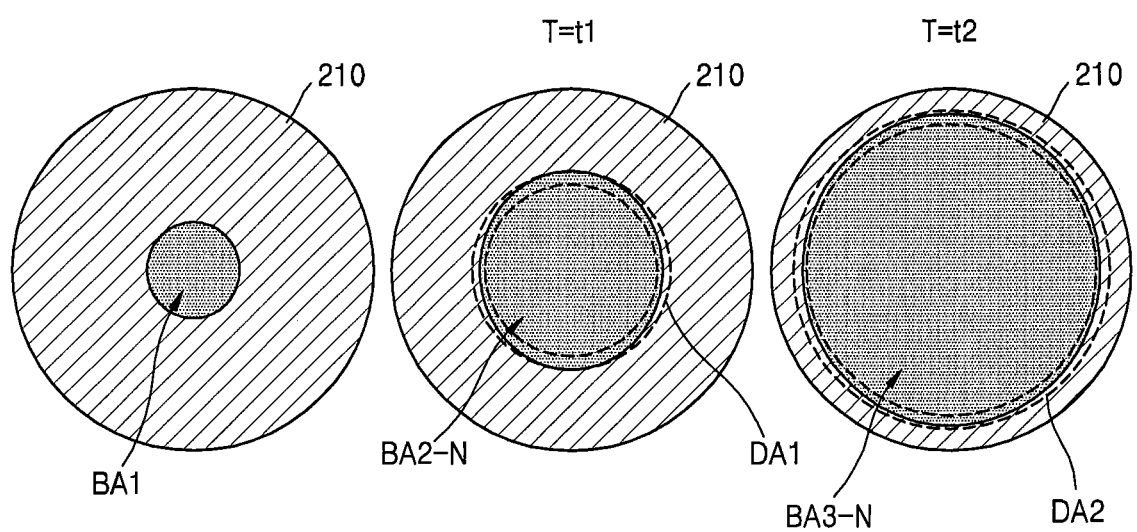
FIG. 6 is a plan view diagram showing a case where a bonding state of a wafer is normal during a wafer bonding process, when the bonding state is detected by the wafer bonding apparatus of FIG. 1A, according to some embodiments of the present inventive concept.

FIG. 6 is a plan view diagram showing a case where a wafer bonding state is normal during a wafer bonding process, where the wafer bonding state is detected by using the wafer bonding apparatus of FIG. 1A. Descriptions thereof are provided below in relation to a case where two determination areas DA1 and DA2 are defined on the first wafer 210 as shown in FIG. 5B.

Referring to FIG. 6, the left drawing shows a dark hatched area corresponding to a first bonding area BA1 in which the first wafer 210 and the second wafer 220 are attached to each other immediately after bonding is started. The first bonding area BA1 may be detected, for example, by the inner portion 140in of the area sensor 140. In other words, immediately after the bonding is started, as a portion of the first wafer 210 separated from the bottom surface Fs1 of the upper supporting plate 110 is detected by the inner portion 140in of the area sensor 140, the first bonding area BA1 may be detected. The first bonding area BA1 may not exactly coincide with the separated portion of the first wafer 210. For example, as shown in FIG. 3C or 4B, the separated portion of the first wafer 210 may be larger than the first bonding area BA1.

The center drawing shows a dark hatched area corresponding to a second bonding area BA2-N formed by propagation of bonding between the first wafer 210 and the second wafer 220 at the first time point t1 after the bonding is initiated. It may be seen that an outer boundary of the second bonding area BA2-N is included in the first determining area DA1. When the outer boundary of the second bonding area BA2-N is included in the first determining area DA1 at the set first time point t1, it may be determined that the propagation of the bonding between the first wafer 210 and the second wafer 220 is normal.

The right drawing shows a third bonding area BA3-N formed by the propagation of the bonding between the first wafer 210 and the second wafer 220 at the set second time point t2 after the bonding is initiated. An outer boundary of the third bonding area BA3-N may be included in the second determining area DA2. When the outer boundary of the third bonding area BA3-N is included in the second determining area DA2 at the set second time point t2, it may be determined that the propagation of the bonding between the first wafer 210 and the second wafer 220 is normal.

It may be checked via any one or both of the first determining area DA1 and the second determining area DA2 whether the propagation of the bonding between the first wafer 210 and the second wafer 220 is normal.

Similar to the first bonding area BA1, the second bonding area BA2-N and the third bonding area BA3-N may not exactly coincide with the separated portions of the first wafer 210 at the first time point t1 and the second time point t2. For example, as shown in FIG. 3C or 4B, the separated portion of the first wafer 210 may be larger than the second bonding area BA2-N at the first time point t1, and the separated portion of the first wafer 210 may be larger than the third bonding area BA3-N at the second time point t2. However, in the wafer bonding apparatus 100 according to some embodiments, it may be determined whether a wafer bonding state is normal by considering that the separated portions of the first wafer 210 substantially coincide with the second bonding area BA2-N and the third bonding area BA3-N. Even when the separated portions of the first wafer 210 have dimensions different from those of the second bonding area BA2-N and the third bonding area BA3-N, distances between wafers are very small, and thus propagation of the bonding between the first wafer 210 and the second wafer 220 and propagation of the separation of the first wafer 210 occur in substantially a same pattern with small time differences.

FIGS. 7A through 7E are plan view diagrams showing cases where a bonding state of a wafer is abnormal during the wafer bonding process, the bonding state detected by using the wafer bonding apparatus of FIG. 1A. Here, FIGS. 7A, 7B, and 7E respectively show dark hatched portions corresponding to second bonding areas BA2-E1, BA2-E2, and BA2-E3 that are formed as bonding between the first wafer 210 and the second wafer 220 propagates at the first time point t1 after the bonding is initiated, and FIGS. 7C and 7D respectively show third bonding areas BA3-E1 and BA3-E2 that are formed as the bonding between the first wafer 210 and the second wafer 220 propagates at the second time point t2 after the bonding is initiated.

Figure 7A:
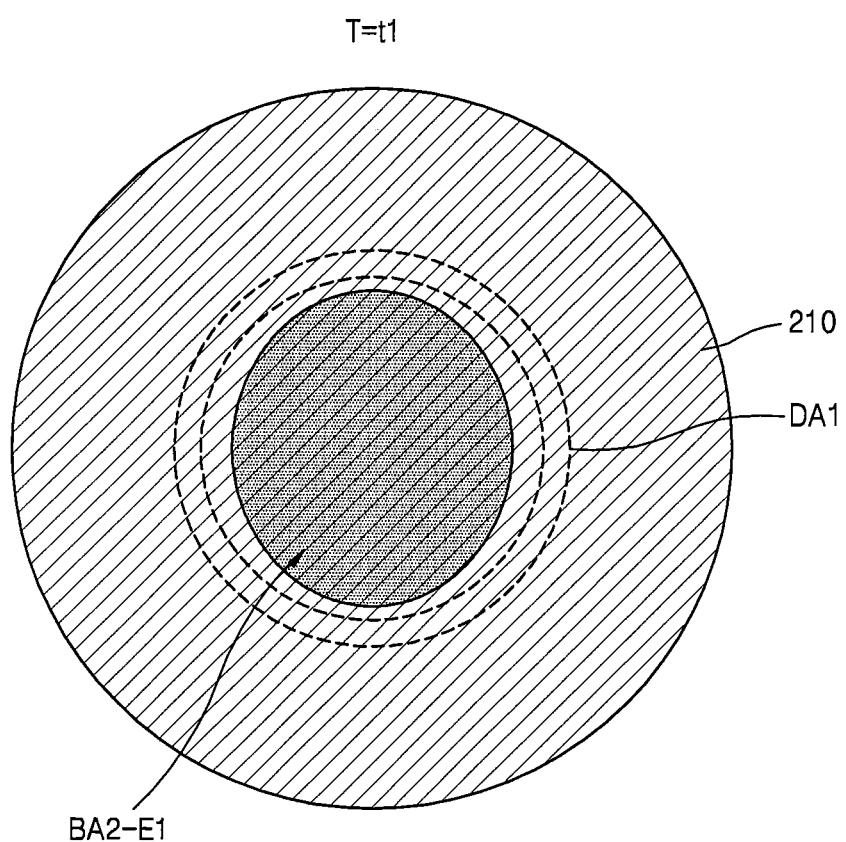
FIGS. 7A through 7E are plan view diagrams showing cases where a bonding state of a wafer is abnormal during the wafer bonding process, when the bonding state is detected by the wafer bonding apparatus of FIG. 1A, according to some embodiments of the present inventive concept.

Referring to FIG. 7A, it may be seen that an outer boundary of the second bonding area BA2-E1 failed to reach the first determining area DA1 at the first time point t1. When the outer boundary of the second bonding area BA2-E1 fails to reach the first determining area DA1 at the first time point t1, it may be determined that the propagation of bonding between the first wafer 210 and the second wafer 220 is abnormal.

Figure 7B:
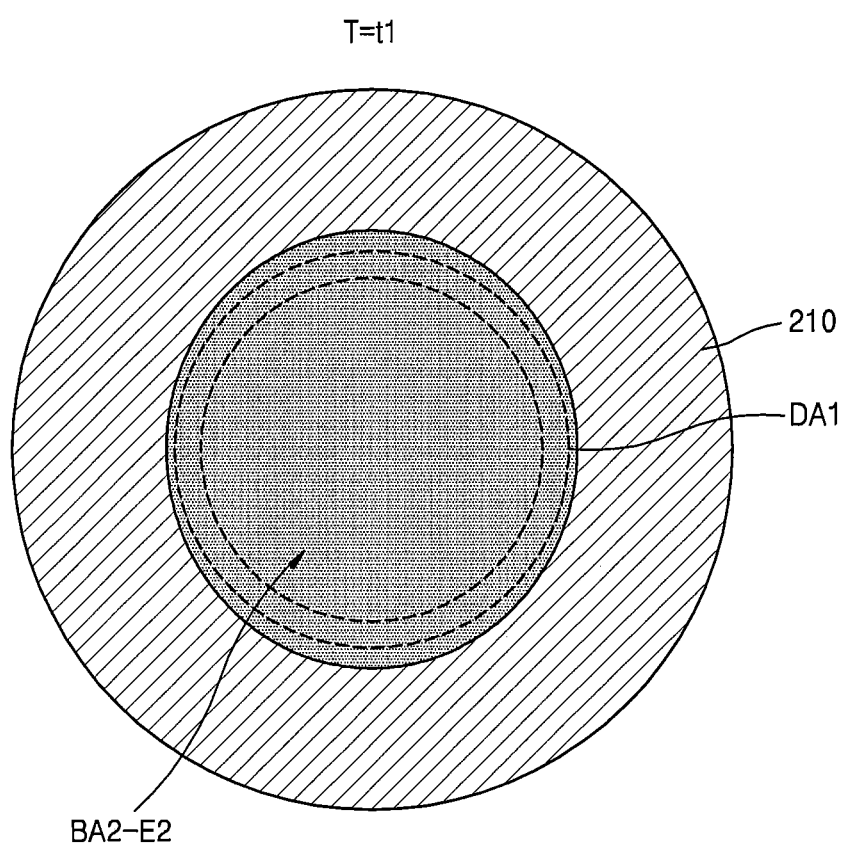

Referring to FIG. 7B, it may be seen that an outer boundary of the second bonding area BA2-E2 has extended past the first determining area DA1 at the first time point t1. When the propagation of the bonding between the first wafer 210 and the second wafer 220 extends past the first determining area DA1, it may be determined that the propagation of bonding between the first wafer 210 and the second wafer 220 is abnormal.

Figure 7C:
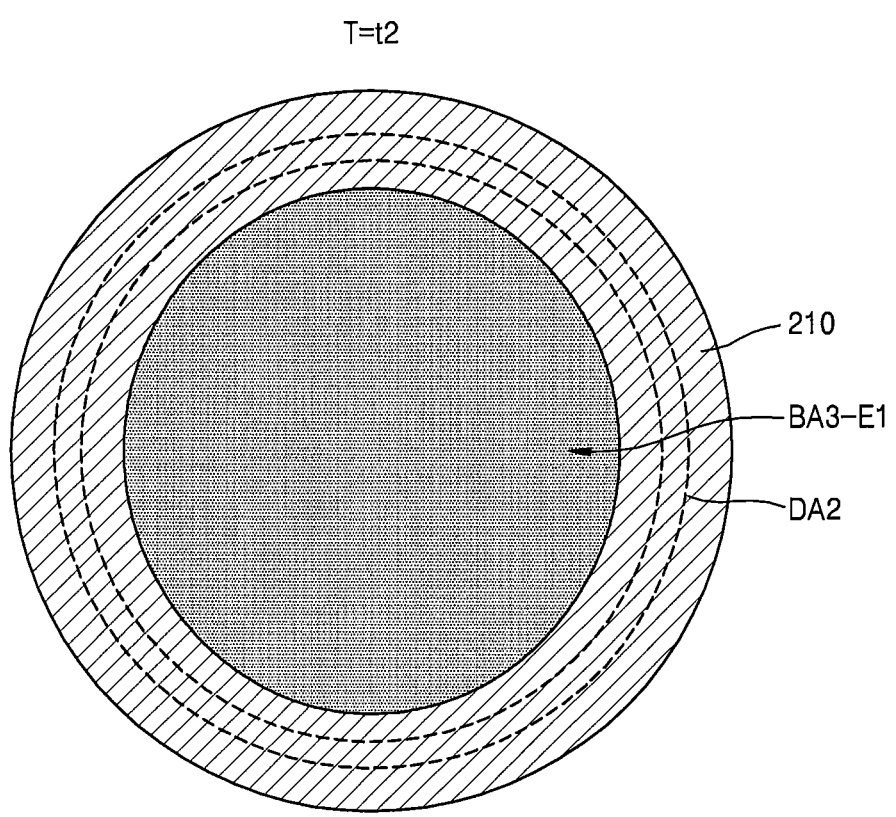

Referring to FIG. 7C, it may be seen that an outer boundary of the third bonding area BA3-E1 failed to reach the second determining area DA2 at the second time point t2. When the outer boundary of the third bonding area BA3-E1 fails to reach the second determining area DA2 at the second time point t2, it may be determined that the propagation of bonding between the first wafer 210 and the second wafer 220 is abnormal.

Furthermore, at the first time point t1, the propagation of the bonding between the first wafer 210 and the second wafer 220 may be normal or abnormal. However, even when it is determined at the first time point t1 that the propagation of the bonding between the first wafer 210 and the second wafer 220 is normal, when it is determined at the second time point t2 that the propagation of the bonding between the first wafer 210 and the second wafer 220 is abnormal, it may be finally determined that the propagation of the bonding between the first wafer 210 and the second wafer 220 is abnormal. Furthermore, when it is determined at the first time point t1 that the propagation of the bonding between the first wafer 210 and the second wafer 220 is abnormal, the propagation of the bonding between the first wafer 210 and the second wafer 220 may be determined as abnormal without a determination at the second time point t2.

Figure 7D:
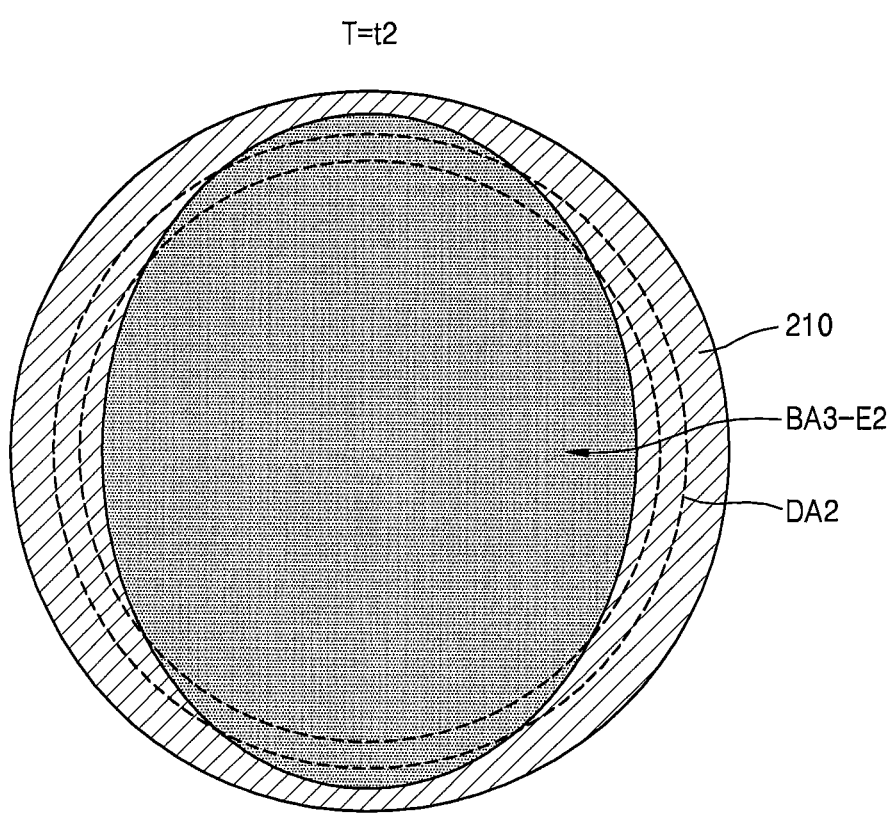

Referring to FIG. 7D, it may be seen that, at the second time point t2, a portion of an outer boundary of the third bonding area BA3-E2 does not reach the second determining area DA2 and another portion of the outer boundary of the third bonding area BA3-E2 extends past the second determining area DA2, and thus bonding is expanding asymmetrically. When the outer boundary of the third bonding area BA3-E2 extends asymmetrically at the second time point t2, it may be determined that propagation of the bonding between the first wafer 210 and the second wafer is abnormal. Even when an outer boundary of a second bonding area extends asymmetrically at the first time point t1, it may be determined that propagation of the bonding between the first wafer 210 and the second wafer is abnormal. Here, a symmetric expansion and an asymmetric expansion may be distinguished based on a width of a determining area. In other words, it may be determined that the outer boundary of a bonding area expands symmetrically when the entire outer boundary of a bonding area is included in the determining area at a set time point, and it may be determined that the outer boundary of the bonding area expands asymmetrically when even a portion of the outer boundary of the bonding area is not included in the determining area at a set time point. However, in terms of a product specification or process control specification, even when a distorted shape is asymmetrical or abnormal, the distorted shape may be determined as normal when the distorted shape results in characteristics of a product being maintained or improved, or production yield being maintained or improved.

Figure 7E:
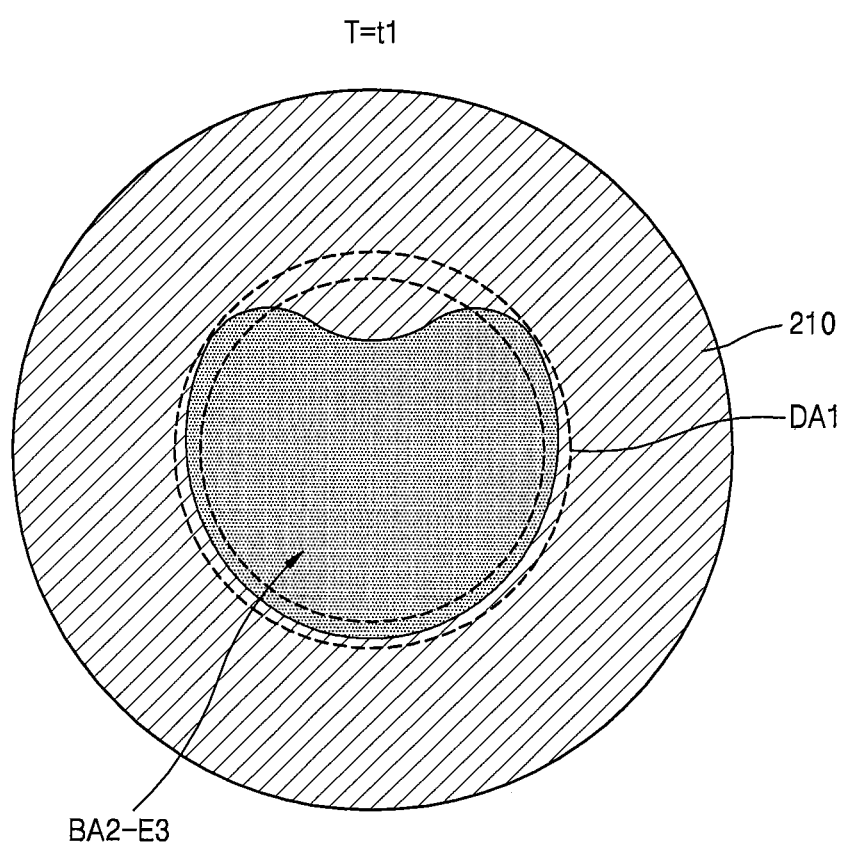

Referring to FIG. 7E, at the first time point t1, most of an outer boundary of the second bonding area BA2-E3 is included in the first determining area DA1 and a portion of the outer boundary of the second bonding area BA2-E3 is not included therein, and thus the second bonding area BA2-E3 is expanding with a partially distorted shape. When the outer boundary of the second bonding area BA2-E3 expands with a partially distorted shape at the first time point t1, it may be determined that the propagation of the bonding between the first wafer 210 and the second wafer 220 is abnormal. Of course, even when the outer boundary of a third bonding area expands with a partially distorted shape at the second time point t2, it may be determined that the propagation of the bonding between the first wafer 210 and the second wafer 220 is abnormal.

There may be various reasons for the abnormal propagations of the bonding between the first wafer 210 and the second wafer 220, as shown in FIGS. 7A through 7E. For example, defects may occur in the propagation of the bonding between the first wafer 210 and the second wafer 220 due to a foreign substance at a specific portion of the first wafer 210 or the second wafer 220 and the propagation of the bonding between the first wafer 210 and the second wafer 220 does not proceed or is slowed in a direction toward the foreign substance. Defects may occur in the propagation when the overall propagation of the bonding between the first wafer 210 and the second wafer 220 is interrupted or slowed as vacuum absorption is stopped inappropriately. Defects may occur when the presence of a material, such as a liquid, at a certain portion or the entirety of first wafer 210 or the second wafer 220 promotes propagation toward the certain portion. Other defects in the propagation may occur but are not described here.

Additionally, in the wafer bonding apparatus 100 according to some embodiments, abnormal bonding states may be checked and recorded according to times and locations. Furthermore, by associating recorded results with locations in the first wafer 210 or the second wafer 220 and/or reasons of defects, a reason for and a location of a defect in a wafer bonding process may be accurately detected. Therefore, the wafer bonding apparatus 100 according to some embodiments may accurately control operations of equipment during the wafer bonding process and enable proper maintenance thereof, by accurately detecting a reason for and/or a location of a defect in the wafer bonding process, thereby significantly improving mass productivity of the wafer bonding process.

FIG. 8 is a schematic diagram of an entire wafer bonding system including the wafer bonding apparatus of FIG. 1A, according to some embodiments of the inventive concept. Descriptions already provided above with reference to FIGS. 1A through 1B will be briefly provided again below or partially omitted for brevity.

Referring to FIG. 8, a wafer bonding system 1000 according to some embodiments includes the wafer bonding apparatus 100, a vertical moving apparatus 200, a vacuum pump 300, a horizontal moving apparatus 400, a controller 500, and a determiner 600.

The wafer bonding apparatus 100 is identical to the wafer bonding apparatus 100 described above with reference to FIG. 1A, but is not limited thereto. The wafer bonding apparatus 100a or 100b of FIG. 2A or 2B may also be applied to the wafer bonding system 1000 according to the present embodiment.

The bonding initiator 130 may include a pointer actuator 132 and a pointer 134. The pointer actuator 132 may be connected to the controller 500 and move the pointer 134 up and down under the control of the controller 500. A wide variety of actuators for moving the pointer 134 up and down may be applied to the pointer actuator 132. For example, a transfer device, a transfer robot, a transfer stage, or one of various other transfer mechanisms including various drive sources, such as a hydraulic cylinder, a pneumatic cylinder, a linear motor, an internal combustion engine, an external combustion engine, and/or a solenoid device, and/or various driving force transferring devices, such as a combination of gears, a combination of links, a combination of a chain and a sprocket wheel, a combination of a wire and a pulley, and/or a combination of a belt and a pulley, may be applied to the pointer actuator 132.

The pointer 134 has a long cylindrical bar-like structure penetrating through the upper supporting plate 110, may be moved downward by the pointer actuator 132, and may press the center portion of the first wafer 210 downward. The bonding initiator 130 of FIGS. 1A, 3A, and 4B is simplified as the pointer 134. On the other hand, since a bottom end portion of the pointer 134 has a round shape, there may be a fine contact area between the pointer 134 and the first wafer 210 when the pointer 134 presses the center portion of the first wafer 210.

The vertical moving apparatus 200 may function to move the upper supporting plate 110 up and down. The vertical moving apparatus 200 may be connected to the controller 500 and move the upper supporting plate 110 up and down under the control of the controller 500. Various types of an actuator 230 capable of moving the upper supporting plate 110 up and down may be applied to the vertical moving apparatus 200. For example, a transfer device, a transfer robot, a transfer stage, or other transfer devices as described above with respect to the pointer actuator 132 may be applied to the actuator 230. Moreover, the vertical moving apparatus 200 may be attached to the lower supporting plate 120 and move the upper supporting plate 110 up and down.

The vacuum pump 300 may be connected to the vacuum grooves 112 via an outside pipeline 310 and an inside pipeline inside the upper supporting plate 110. The vacuum pump 300 supplies a vacuum to the vacuum grooves 112 to allow the first wafer 210 to be vacuum-adsorbed. The vacuum pump 300 may be connected to the controller 500 and provide a vacuum to the vacuum grooves 112 under the control of the controller 500. Here, the supply of the vacuum from the vacuum pump 300 corresponds to the vacuum absorption by the vacuum grooves 112, and the stopping of the supply of the vacuum from the vacuum pump 300 corresponds to the stopping of the vacuum absorption at the vacuum grooves 112.

The horizontal moving apparatus 400 may move the lower supporting plate 120 in horizontal directions. According to some embodiments, the horizontal moving apparatus 400 may move the lower supporting plate 120 not only horizontally but also vertically. Although not shown, the horizontal moving apparatus 400 may also be connected to the controller 500 and operated under the control of the controller 500.

The controller 500 may be connected to respective components of the wafer bonding system 1000 and control overall operations of the components. For example, the controller 500 may be implemented in the form of a circuit, an electronic component, a microprocessor, or a program capable of applying a movement control signal to the bonding initiator 130, the vertical moving apparatus 200, and/or the horizontal moving apparatus 400, and/or also applying a vacuum control signal to the vacuum pump 300. Furthermore, the controller 500 may also be connected to the area sensor 140 and control the operation of the area sensor 140.

The determiner 600 analyzes the results of detection from the area sensor 140 and determines whether propagation of bonding between the first wafer 210 and the second wafer 220 is normal. Specifically, when the area sensor 140 detects a pressure change, an electrical change, or a distance change in determining areas at a set time point, the determiner 600 may determine that the propagation of the bonding between the first wafer 210 and the second wafer 220 is normal. In other words, as shown in FIG. 6, when the outer boundaries of the bonding areas BA2-N and BA3-N are included in the determination areas DA1 and DA2 at a set time point, the determiner 600 may determine that the propagation of the bonding between the first wafer 210 and the second wafer 220 is normal.

In cases where the area sensor 140 does not detect a pressure change, an electrical change, or a distance change in the determination areas at the set time point, when the area sensor 140 detects a pressure change, an electrical change, or a distance change in the determination areas before the set time point, or when the area sensor 140 detects a pressure change, an electrical change, or a distance change in the determination areas asymmetrically, the determiner 600 may determine that the propagation of the bonding between the first wafer 210 and the second wafer 220 is abnormal. In other words, the determiner 600 may determine that the propagation of the bonding between the first wafer 210 and the second wafer 220 is abnormal when the outer boundaries of bonding areas BA2-E1, BA2-E2, and BA3-E1 do not reach or extend past the determination areas DA1 and DA2 at a set time point as shown in FIG. 7A through 7C or when the outer boundaries of the bonding areas BA3-E2 and BA2-E3 extend asymmetrically at the set time point as shown in FIG. 7D or 7E.

The determiner 600 may suitably define determining areas according to times and locations. Furthermore, the determiner 600 may analyze a result of detection from the area sensor 140, thereby identifying a reason for a defect and detecting a location of the defect. For example, the determiner 600 may check and record abnormal states of propagation of a bonding by times and locations and associate the recorded results with locations in the first wafer 210 or the second wafer 220 and/or reasons for defects, thereby detecting a reason for and/or a location of a defect in a wafer bonding process. According to some embodiments, the determiner 600 may be included in the wafer bonding apparatus 100.

Moreover, the determiner 600 is connected to the controller 500, and the controller 500 may control the wafer bonding system 1000 according to a result of determination of the determiner 600. For example, when the determiner 600 determines that propagation of bonding is defective, the controller 500 may remove the first wafer 210 and the second wafer 220 from the wafer bonding apparatus 100 and discard the first wafer 210 and the second wafer 220 or stop the entire wafer bonding process to allow proper maintenance.

A wafer bonding apparatus according to the inventive concept and a wafer bonding system including the wafer bonding apparatus may two-dimensionally detect a propagation state of bonding between a first wafer and a second wafer by using an area sensor disposed at an upper supporting plate, thereby accurately detecting a state of the bonding between the first wafer and the second wafer.

Furthermore, when it is determined that bonding between wafers is abnormal, the wafer bonding apparatus according to the inventive concept and the wafer bonding system including the wafer bonding apparatus may detect an accurate location of a defect by using a result detected by the area sensor. Therefore, the wafer bonding apparatus according to the inventive concept and the wafer bonding system including the wafer bonding apparatus may significantly improve mass productivity of a wafer bonding process by detecting a defective product or a defective wafer, accurately controlling operation of equipment, and/or allowing proper maintenance of the equipment during the wafer bonding process. As used herein, the term "and/or" includes any and all combinations of one or more of the associated listed items.

While the inventive concept has been particularly shown and described with reference to embodiments thereof, it will be understood that various changes in form and details may be made therein without departing from the spirit and scope of the following claims.

What is claimed is:

1. A wafer bonding apparatus comprising:
   a first supporting plate comprising a first surface and a plurality of vacuum grooves for vacuum-absorption of a first wafer on the first surface;
   a second supporting plate comprising a second surface facing the first surface, wherein a second wafer is on the second surface;
   a bonding initiator on the first supporting plate, wherein the bonding initiator is configured to initiate bonding between the first wafer to the second wafer; and
   an area sensor on the first supporting plate, wherein the area sensor is configured to detect a propagation state of bonding between the first wafer and the second wafer,
   wherein in a direction extending radially from the bonding initiator, the area sensor is closer in distance to the bonding initiator than respective distances of each of the plurality of vacuum grooves.

2. The wafer bonding apparatus of claim 1, wherein the area sensor is further configured to detect a propagation state of the bonding between the first wafer and the second wafer by detecting, based on set time points or locations of the first wafer, at least one of a pressure change, an electrical change, or a change of a distance from the first surface to the first wafer.

3. The wafer bonding apparatus of claim 1, wherein the bonding initiator is further configured to initiate the bonding between the first wafer and the second wafer by pressing a center portion of the first wafer towards the second wafer, and wherein the area sensor is further configured to detect a state of the bonding between the first wafer and the second wafer propagating from a center portion of the first wafer to an outer portion of the first wafer.

4. The wafer bonding apparatus of claim 1, wherein the area sensor is on a first portion of the first supporting plate that is different from a second portion of the first supporting plate corresponding to the plurality of vacuum grooves,
   wherein the area sensor is a touch sensor to which one of a resistive mechanism, a capacitive mechanism, an infrared ray (IR) mechanism, or a surface acoustic wave (SAW) mechanism is applied, and
   wherein the area sensor is further configured to detect a state in which the first wafer is separated from the first surface.

5. The wafer bonding apparatus of claim 1, wherein the plurality of vacuum grooves have annular shapes formed on the first supporting plate,
   wherein the first wafer is fixed onto the first surface via vacuum-absorption of the at least two vacuum grooves, and,
   wherein after the bonding between the first wafer and the second wafer is initiated by pressing of the bonding initiator onto the first wafer, vacuum absorption is sequentially stopped from a vacuum groove close to the center portion of the first supporting plate to a vacuum groove at an outer portion of the first supporting plate, or vacuum absorption is sequentially stopped toward a vacuum groove at the outer portion of the first supporting plate, after vacuum absorption at a vacuum groove close to the center portion of the first supporting plate is stopped and the bonding between the first wafer and the second wafer is initiated by the pressing of the bonding initiator onto the first wafer.

6. The wafer bonding apparatus of claim 1, wherein at least one circular determining area around a center portion of the first wafer is defined, and
   wherein the area sensor is further configured to detect at least one change comprising a pressure change, an electrical change, and/or a distance change in the at least one determining area,
   wherein the area sensor is further configured to determine a propagation state of the bonding between the first wafer and the second wafer based on the at least one change.

7. The wafer bonding apparatus of claim 6, wherein, when the area sensor is further configured to detect the at least one change in the at least one determining area at a set time point, the bonding between the first wafer and the second wafer is determined to be normal, and,
   wherein, in at least one of a first case comprising the area sensor not detecting the at least one of the changes in the at least one determining area at the set time point, a second case comprising the area sensor detecting the at least one change in the at least one determining area before the set time point, or a third case comprising the area sensor asymmetrically detecting the at least one of the changes in the at least one determining area, the bonding between the first wafer and the second wafer is determined to be abnormal.

8. The wafer bonding apparatus of claim 6, wherein the at least one determining area comprises an annular shape having a width,
   wherein a first determining area close to the center portion of the first wafer and a second determining area close to an outer portion of the first wafer are defined, and wherein the area sensor is further configured to detect whether the first wafer is separated from the first surface at the first determining area at a first time point and/or to detect whether the first wafer is separated from the first surface at the second determining area at a second time point.

9. A wafer bonding apparatus comprising:
a first supporting plate comprising a first surface and a plurality of vacuum grooves for vacuum-absorption of a first wafer on the first surface;
a second supporting plate comprising a second surface facing the first surface, wherein a second wafer is on the second surface;
a sensor on the first supporting plate that is configured to detect a state of bonding between the first wafer and the second wafer by two-dimensionally detecting whether the first wafer is separated from the first surface; and
a bonding initiator at a center portion of the first supporting plate,
wherein during the bonding between the first wafer and the second wafer, vacuum absorption is sequentially stopped from a vacuum groove close to the center portion of the first supporting plate to a vacuum groove at an outer portion of the first supporting plate, and
wherein the bonding initiator presses the center portion of the first supporting plate after the vacuum absorption is stopped.

10. The wafer bonding apparatus of claim 9, wherein the sensor comprises a touch sensor to which one of a resistive mechanism, a capacitive mechanism, an infrared ray (IR) mechanism, and/or a surface acoustic wave (SAW) mechanism is applied, and
wherein the sensor is further configured to detect whether the first wafer is separated from the first surface by detecting, according to set time points or locations of the first wafer, at least one change comprising a pressure change, an electrical change, or a change of a distance from the first surface to the first wafer.

11. The wafer bonding apparatus of claim 9,
wherein the bonding initiator is configured to press the center portion of the first supporting plate downward to initiate bonding between the first wafer and the second wafer.

12. The wafer bonding apparatus of claim 11, wherein, when the bonding between the first wafer and the second wafer is initiated by the bonding initiator, as the bonding between the first wafer and the second wafer propagates from a center portion of the first wafer to an outer portion of the first wafer, separation of the first wafer from the first surface propagates from the center portion of the first wafer to the outer portion of the first wafer, and
wherein the sensor is further configured to detect separation of the first wafer from the first surface.

13. The wafer bonding apparatus of claim 11, wherein at least two vacuum grooves having annular shapes are formed on the first supporting plate,
wherein the sensor is on a first portion of the first supporting plate that is different from a second portion of the first supporting plate corresponding to the at least two vacuum grooves.

14. The wafer bonding apparatus of claim 9, wherein at least one circular determining area around a center portion of the first wafer is defined, and
wherein the sensor detects a propagation state of the bonding between the first wafer and the second wafer by detecting whether the at least one determining area is separated from the first surface.

15. A wafer bonding system comprising:
a chamber;
a first supporting plate, in an upper portion of an interior of the chamber, the first supporting plate comprising a first surface and a plurality of vacuum grooves configured to vacuum-absorb a first wafer located on the first surface;
a second supporting plate in a lower portion of the interior of the chamber, the second supporting plate comprising a second surface facing the first surface, wherein a second wafer is on the second surface;
a vertical moving apparatus configured to move the first supporting plate up or down;
a bonding initiator on the first supporting plate that is configured to press the center portion of the first wafer toward the second wafer to initiate bonding between the first wafer and the second wafer;
a vacuum pump configured to supply a vacuum to the plurality of vacuum grooves of the first supporting plate;
a controller configured to control the vertical moving apparatus, the bonding initiator, and/or the vacuum pump; and
an area sensor on the first supporting plate that is configured to detect a propagation state of the bonding between the first wafer and the second wafer,
wherein in a direction extending radially from the bonding initiator, the area sensor is closer in distance to the bonding initiator than respective distances of each of the plurality of vacuum grooves.

16. The wafer bonding system of claim 15, wherein the area sensor is a touch sensor to which one of a resistive mechanism, a capacitive mechanism, an infrared ray (IR) mechanism, and a surface acoustic wave (SAW) mechanism is applied, and
wherein the area sensor is further configured to detect a propagation state of the bonding between the first wafer and the second wafer by detecting at least one of changes comprising a pressure change, an electrical change, and a change of a distance from the first surface to the first wafer, based on whether the first wafer is separated from the first surface.

17. The wafer bonding system of claim 15, wherein the plurality of vacuum grooves comprises at least two vacuum grooves having annular shapes that are formed on the first supporting plate,
wherein the area sensor is on a first portion of the first supporting plate that is different from a second portion of the first supporting plate corresponding to the at least two vacuum grooves,
wherein during the bonding between the first wafer and the second wafer, the controller is further configured to control the vacuum pump such that vacuum absorption is sequentially stopped from a vacuum groove close to the center portion of the first supporting plate to a vacuum groove at an outer portion of the first supporting plate, and
wherein the controller is further configured to control the bonding initiator to perform the pressing before the stopping of the vacuum absorption is initiated or after the vacuum absorption is stopped.

18. The wafer bonding system of claim 15, further comprising:
a determiner configured to determine whether the propagation of the bonding between the first wafer and the second wafer is normal, wherein at least one circular determining area around the center portion of the first wafer is defined, wherein the area sensor is further configured to detect at least one change comprising a pressure change, an electrical change, or a distance change in the at least one determining area, and wherein the determiner is further configured to analyze a result of the detection by the area sensor to determine whether a propagation state of the bonding between the first wafer and the second wafer is normal.

19. The wafer bonding system of claim 18, wherein, when the area sensor detects the at least one of the changes in the at least one determining area at a set time point, the determiner is further configured to determine that the bonding between the first wafer and the second wafer is determined to be normal, and, in at least one of a first case comprising the area sensor not detecting the at least one change in the at least one determining area at the set time point, a second case comprising the area sensor detecting the at least one change in the at least one determining area before the set time point, or a third case comprising the area sensor asymmetrically detecting the at least one change in the at least one determining area, the determiner is configured to determine that the bonding between the first wafer and the second wafer is abnormal.

20. The wafer bonding system of claim 18, wherein, when the determiner is further configured to determine that the propagation of the bonding between the first wafer and the second wafer is abnormal, the controller removes the first wafer and/or the second wafer or stops a wafer bonding process.

* * * * *